United States Patent [19]
Tahara

[11] Patent Number: 5,457,425
[45] Date of Patent: Oct. 10, 1995

[54] INPUT CIRCUIT USED IN APPARATUS FOR MEASURING ELECTRIC SIGNAL

[75] Inventor: Akihiro Tahara, Kodaira, Japan

[73] Assignee: Hitachi Denshi Kabushiki Kaisha, Tokyo, Japan

[21] Appl. No.: 306,573

[22] Filed: Sep. 15, 1994

[30] Foreign Application Priority Data

Sep. 16, 1993 [JP] Japan .................... 5-253720

[51] Int. Cl.⁶ ..................................... H03F 1/14
[52] U.S. Cl. ......................................... 330/51; 330/126
[58] Field of Search ................... 330/51, 124 R, 330/126, 295, 300

[56] References Cited

U.S. PATENT DOCUMENTS 5,121,075  6/1992  Roach ........................... 330/126

FOREIGN PATENT DOCUMENTS 5910506  6/1979  Japan .
6115622  10/1980  Japan .

Primary Examiner—Steven Mottola
Attorney, Agent, or Firm—Antonelli, Terry, Stout & Kraus

[57] ABSTRACT

An input circuit for an apparatus for measuring an electric signal having a measuring section to measure an electric signal. An input signal path for outputting an input signal to be measured from an input terminal to the output side has a composite buffer amplifier connected to the output side. The composite buffer amplifier includes a high frequency amplifying circuit which amplifies a high frequency signal component of the input signal, a first switch whose input is selectively connected to one of the output of the input signal path and a ground level, a low frequency amplifying circuit which is connected to an output of the first switch and amplifies a low frequency signal component of an output signal from the first switch, an addition point for adding the output of the high frequency amplifying circuit and the output of the low frequency amplifying circuit and for outputting to the measuring section of the utilizing apparatus, a negative feedback circuit for negative-feeding back the output of the addition point to the input side of the first switch, and a second switch, interlocked with the first switch, for selectively shutting off the power source voltage that is supplied to the high frequency amplifying circuit while maintaining the high frequency amplifying circuit operative.

11 Claims, 3 Drawing Sheets

INPUT CIRCUIT USED IN APPARATUS FOR MEASURING ELECTRIC SIGNAL

BACKGROUND OF THE INVENTION

1. Field of the Invention

The invention relates to the improvement of an input circuit used in an apparatus for measuring an electric signal such as an FFT analyzer represented by an oscilloscope, digitizer for sampling a waveform, or the like.

2. Description of the Related Art

FIG. 1 is a circuit diagram showing an example of an input circuit of a conventional apparatus for measuring an electric signal. The input circuit comprises an input coupling switching section at the front stage and a composite buffer amplifier at the post stage.

In FIG. 1, an electric signal to be measured is given to one input terminal X of a switch S3 for ground switching through an input connector 1. Another input terminal Y of the switch S3 is connected to the ground. The output of the switch S3 is directly connected to one input terminal X of a switch S1 and is also connected to another input terminal Y of the switch S1 through an AC coupling capacitor C1. The switch S1 is a switch for switching the input coupling. When the movable member of the switch S1 is connected to the terminal X, DC coupling is performed. When the movable member is connected to the terminal Y, AC coupling is executed. The output of the switch S1 is connected to an input of a switch S2a. One output terminal X of the switch S2a is directly connected to one input terminal X of a switch S2b, while the other output terminal Y or the switch 52a is connected to the other input terminal Y of the switch S2b through an attenuator 3. The switches S2a and S2b interlockingly function as a switch for switching an attenuation ratio. An input coupling switching section (input signal path) 10 is formed by the above construction.

The output of the switch S2b is connected through a capacitor C2 to the gate of a buffer transistor TR1 serving as, for example, a source-follower FET buffer. The source of the buffer transistor TR1 is connected to a power source V+, while the drain is connected through a resistor R5 to an addition point B of a low frequency signal and a high frequency signal. A resistor R4 is connected between the gate of the buffer transistor TR1 and the addition point B. A high frequency signal path (high frequency amplifying circuit), through which a high frequency component of the electric signal to be measured that was input from the input coupling switching section passes is formed by the capacitor C2, buffer transistor TR1, and resistor R5.

The output of the switch S2b, on the other hand, is also connected through a resistor R1 to, for instance, an inverting input of an amplifier A1, such as, for example, a DC operational amplifier. A non-inverting input of the amplifier A1 is connected to the ground. The output of the amplifier A1 is connected to the base of a transistor TR2 for current conversion. A feedback capacitor C3 is connected between the input and output of the amplifier A1. A lower frequency signal path (low frequency amplifying circuit) through which a low frequency component of the electric signal to be measured that was input from the input coupling switching section, is formed by the amplifier A1, resistor R1, and transistor TR2. The collector of the transistor TR2 is connected to the addition point B, while the emitter is connected to a power source V− through a resistor R7. Therefore, the low frequency signal from the low frequency signal path and the high frequency signal from the high frequency signal path are added at the addition point B. The added signal is sent to an output terminal 2 through a buffer amplifier A2 and is also supplied to the inverting input of the amplifier A1 through an inverting buffer amplifier A3 and a resistor R2. A feedback loop of the low frequency signal path is constructed by the amplifier A3 and resistor R2. A composite buffer amplifier 20 is formed by the above construction. Such a composite buffer amplifier is shown in, for example, JP-B-59-10506. The output terminal 2 is connected to a measuring section (not shown) of the apparatus for measuring the electric signal.

For example, in the case of a well-known digital oscilloscope, digitizer for sampling a waveform, or FFT analyzer, the output terminal 2 is connected to a preamplifier and an output thereof is supplied to a trigger circuit and an A/D converter, respectively. In case of a well-known analog oscilloscope, the output terminal 2 is connected to the preamplifier and an output thereof is connected to a trigger circuit system and a vertical axis circuit system, respectively.

Hitherto, when confirming a reference ground level, as shown in FIG. 1, the movable member of the switch S3 is connected to the terminal Y, an input signal line (line from the input connector 1 to a connecting point of the capacitor C2 and resistor R1) is disconnected from the input connector 1 and is connected to the ground, and the switch S1 is connected to the terminal X side.

As mentioned above, in the case where the apparatus for measuring an electric signal is, for example, an oscilloscope, a line indicative of the ground level is generated onto a display (not shown) and the position of the line is checked, thereby confirming the reference ground level.

SUMMARY OF THE INVENTION

However, since the signal of the switch S3 is directly input to the input signal line, it is necessary to design the switch S3 so as to have a high withstanding voltage. In the case where the measuring apparatus is an oscilloscope, since the input circuit is ordinarily equivalently a parallel circuit comprising the resistor of 1 MΩ and a capacitor of about 20 pF, the input impedance of the input circuit needs to be a high impedance.

Since a low pass filter is formed by the input capacitor and the input signal source resistor and the input frequency band is limited due to this, it is desirable that the input capacitance be as small as possible in order to widen the input frequency band.

To satisfy such conditions of the high withstanding voltage and low capacitance in the input circuit, an electronic switch cannot be used as a switch S3 and it is inevitably necessary to use a mechanical switch or relay. Particularly, since there is at present a high requirement to realize a programmable construction which enables remote control to be performed from an external computer for control or the like, it is inevitable to use a relay that can be digitally controlled as a switch.

On the other hand, the signal path from the input connector 1 to the gate of the input FET buffer transistor TR1 functions as a resonator, and, in order to realize a wide band, it is necessary to make the signal line length as short as possible and to increase a resonance frequency. However, when the switch S3 for ground switching is provided for the input section as in the conventional system, the signal path becomes longer by a length corresponding to the switch or relay, so that it is disadvantageous for realization of a wide band.

As mentioned above, according to the system in which the switch for grounding is provided in the input signal line, a relay that can be digitally controlled needs to be used as such a switch in order to enable the programmable construction to be easily realized. There are, however, drawbacks such that the costs of the relay are high and the electric power consumption is large. The signal path becomes longer by a length corresponding to the wire of the relay and it is difficult to realize a wide band.

It is an object of the invention to provide an input circuit of an apparatus for measuring an electric signal, wherein the input circuit has a switch for ground switching and can solve the above problems.

Another object of the invention is to provide an input circuit of an apparatus for measuring an electric signal, wherein the input circuit has a switch for ground switching and has low costs, a low electric power consumption, and a wide band.

According to an aspect of the present invention, there is provided an input circuit used in an apparatus having a measuring section for measuring an electric signal which includes: an input signal circuit portion having an input terminal and an output terminal, an input signal to be measured being supplied to the input terminal, and an electric signal to be measured being output from the output terminal; and a composite buffer amplifying circuit connected to the output terminal of the input signal circuit portion, wherein the composite buffer amplifying circuit includes a high frequency amplifying circuit which is connected to the output terminal of the input signal circuit portion and amplifies a high frequency signal component of the input signal to be measured, a first switch whose input is selectively connected to one of the output terminal of the input signal circuit portion and a ground level terminal and which selectively outputs one of the electric signal to be measured from the output terminal and the ground level, a low frequency amplifying circuit which is connected to an output of the first switch and amplifies a low-frequency signal component of an output signal from the first switch, an adding point for adding the output of the high frequency amplifying circuit and the output of the low frequency amplifying circuit to obtain an added signal and for outputting the added signal to the measuring section, a negative feedback path for negative-feeding back the added signal from the adding point to the first switch, and a second switch for selectively shutting off a power source voltage that is supplied to the high frequency amplifying circuit in an interlocking relation with the first switch.

According to an example of the present invention, the composite buffer amplifier further includes a unit for supplying the output of the high frequency amplifying circuit to the low frequency amplifying circuit as an operation current to make the low frequency amplifying circuit operative; and a unit for supplying the operation current to make the low frequency amplifying circuit operative to the low frequency amplifying circuit for a period of time during which the second switch shuts off the power source voltage that is supplied to the high frequency amplifier.

As mentioned above, according to an example of the invention, the first switch (switch for ground switching) to supply a ground level is provided in the composite buffer amplifier at the post stage of the input coupling switching section (input signal path), namely, it is provided between the feedback signal addition point as an input side of the low frequency amplifying circuit constituting the composite buffer amplifier and the input coupling switching section. Further, the second switch, for selectively shutting off the power source that is supplied to the high frequency amplifying circuit interlockingly with the switch for ground switching, is provided.

According to an example of the invention, the output of the high frequency amplifying circuit is given as a bias current (operation current) to the low frequency amplifying circuit. Therefore, there is provided means for giving the bias current to the low frequency amplifying circuit when the high frequency amplifying circuit is shut off by the second switch.

As mentioned above, the switch for ground switching is provided at a front stage of the feedback signal addition point of the composite buffer amplifier at the post stage, thereby detecting the ground level on the low frequency amplifying circuit side. On the other hand, when the switch for ground switching is in a grounding state (namely, when the input circuit generates the ground level), if it is assumed that the high frequency amplifying circuit is held in the on state, the high frequency signal component from the high frequency amplifying circuit is output from the output terminal, so that the ground level cannot be detected. Therefore, the power source voltage that is supplied to the high frequency amplifying circuit is turned off, thereby preventing the high frequency signal component being output from the high frequency amplifying circuit. In this instance, since the bias current is not supplied to the low frequency amplifying circuit, means for supplying the bias current to the low frequency amplifying circuit when the switch for ground switching is in the grounding state is provided, thereby assuring a feedback current of a feedback loop of the low frequency amplifying circuit.

As mentioned above, since the switch for ground switching is provided at the front stage of the addition point of the feedback loop of the low frequency amplifying circuit, the voltage that is applied to the switch is maintained to a voltage near about 0 V. Therefore, there is no need to use a switch of a high withstanding voltage. Consequently, an inexpensive electronic switch of a low withstanding voltage and a low electric power consumption which is easily programmable, for example, an electronic switch of the CMOS type, can be used. Since the switch for ground switching is not provided for the input coupling switching section (input signal path), the signal path length of the input coupling switching section can be reduced compared to that of the conventional one, so that the input circuit of a wide band can be realized.

DESCRIPTION OF THE PREFERRED EMBODIMENT

Figure 2:
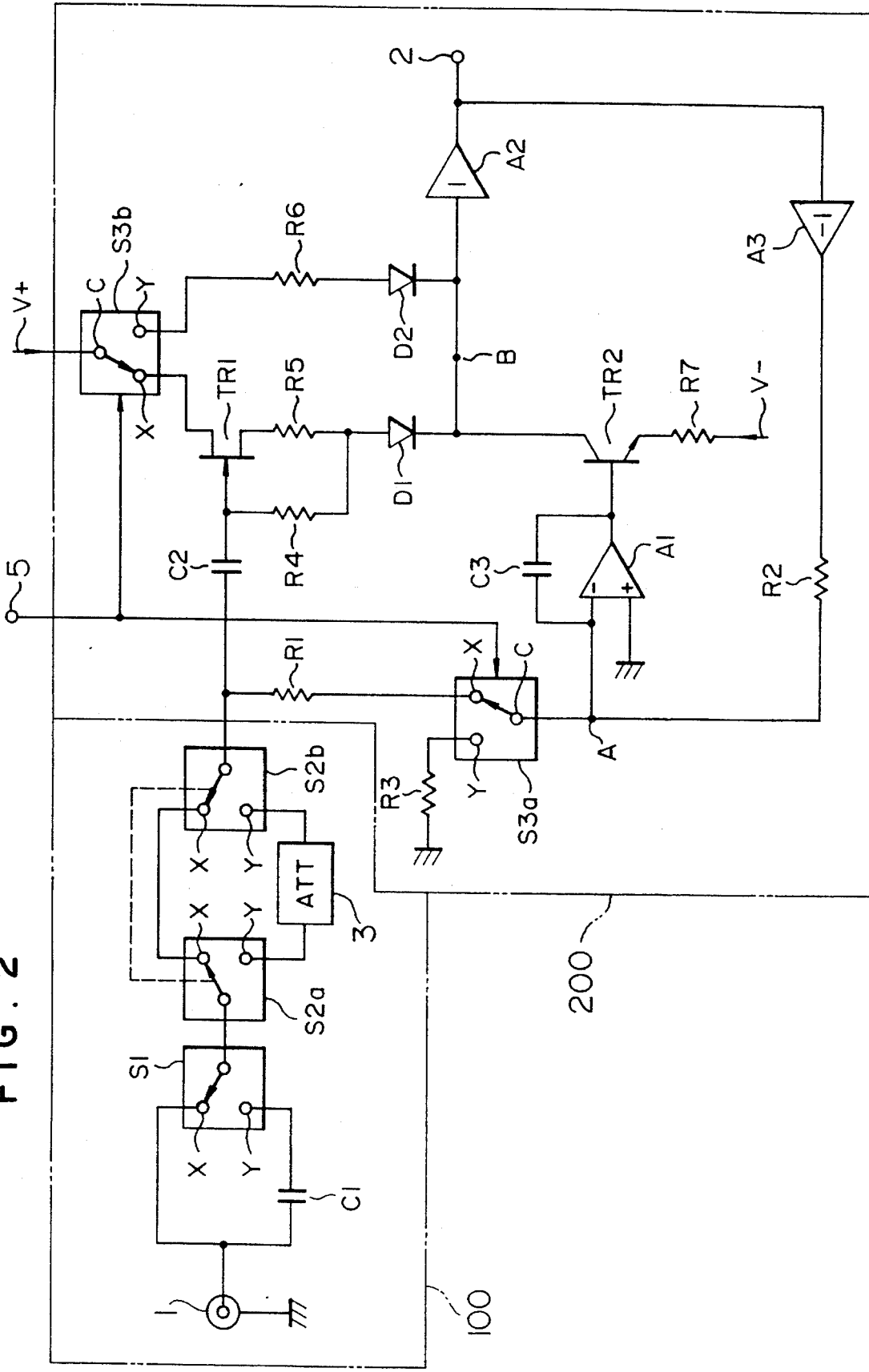
FIG. 2 is a circuit diagram showing one embodiment of an input circuit of an apparatus for measuring an electric signal according to the invention.
Figure 3:
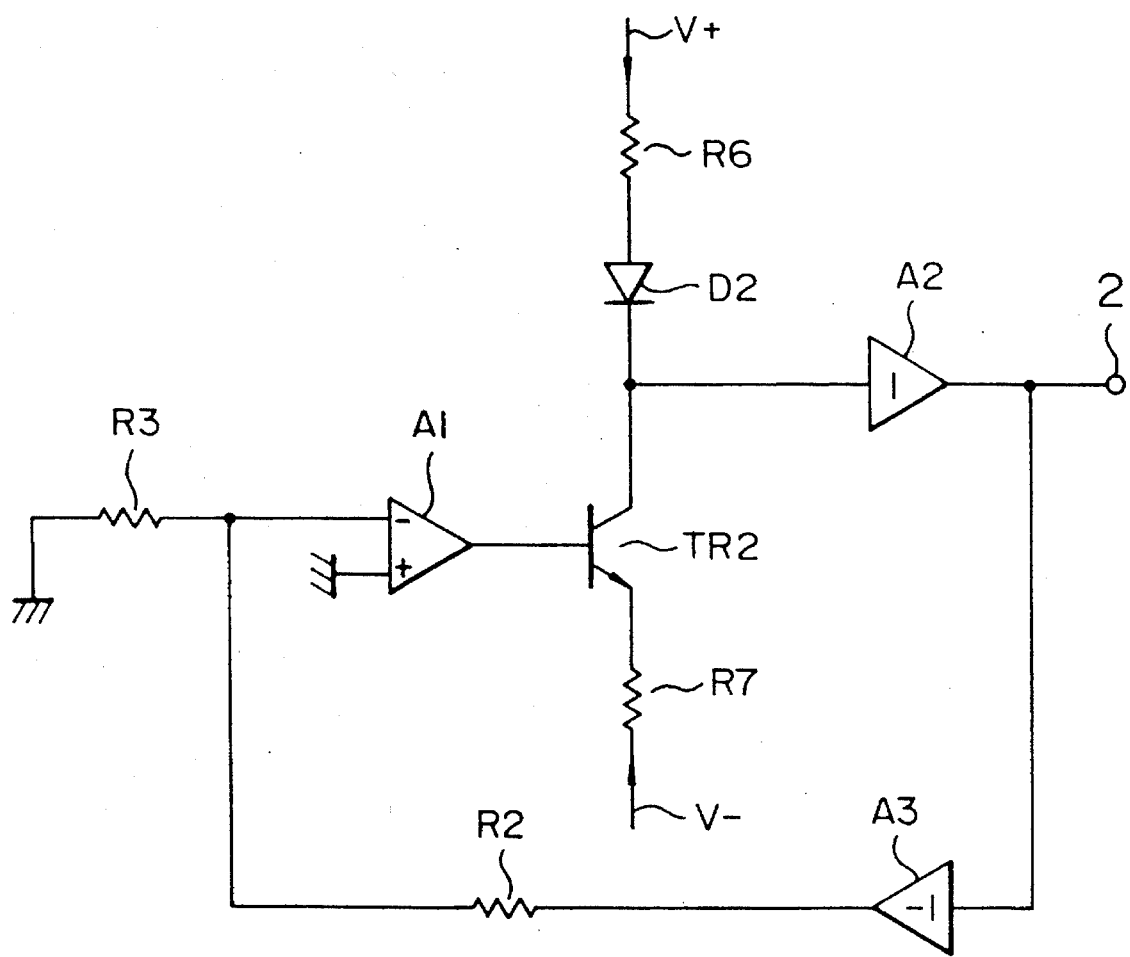
FIG. 3 is a circuit diagram showing an equivalent circuit of the input circuit when the switch for ground switching is switched to the ground side in the input circuit shown in FIG. 2.

An embodiment of an input circuit of an apparatus for measuring an electric signal according to the invention will be described in detail hereinbelow with reference to FIGS. 2 and 3. In FIGS. 2 and 3, elements having substantially the same functions as those shown in FIG. 1 are designated by the same reference numerals, and their descriptions are omitted here.

A construction of the input circuit of the apparatus for measuring the electric signal according to an embodiment of the invention shown in FIG. 2 differs from that of the conventional circuit in FIG. 1 as follows.

Figure 1:
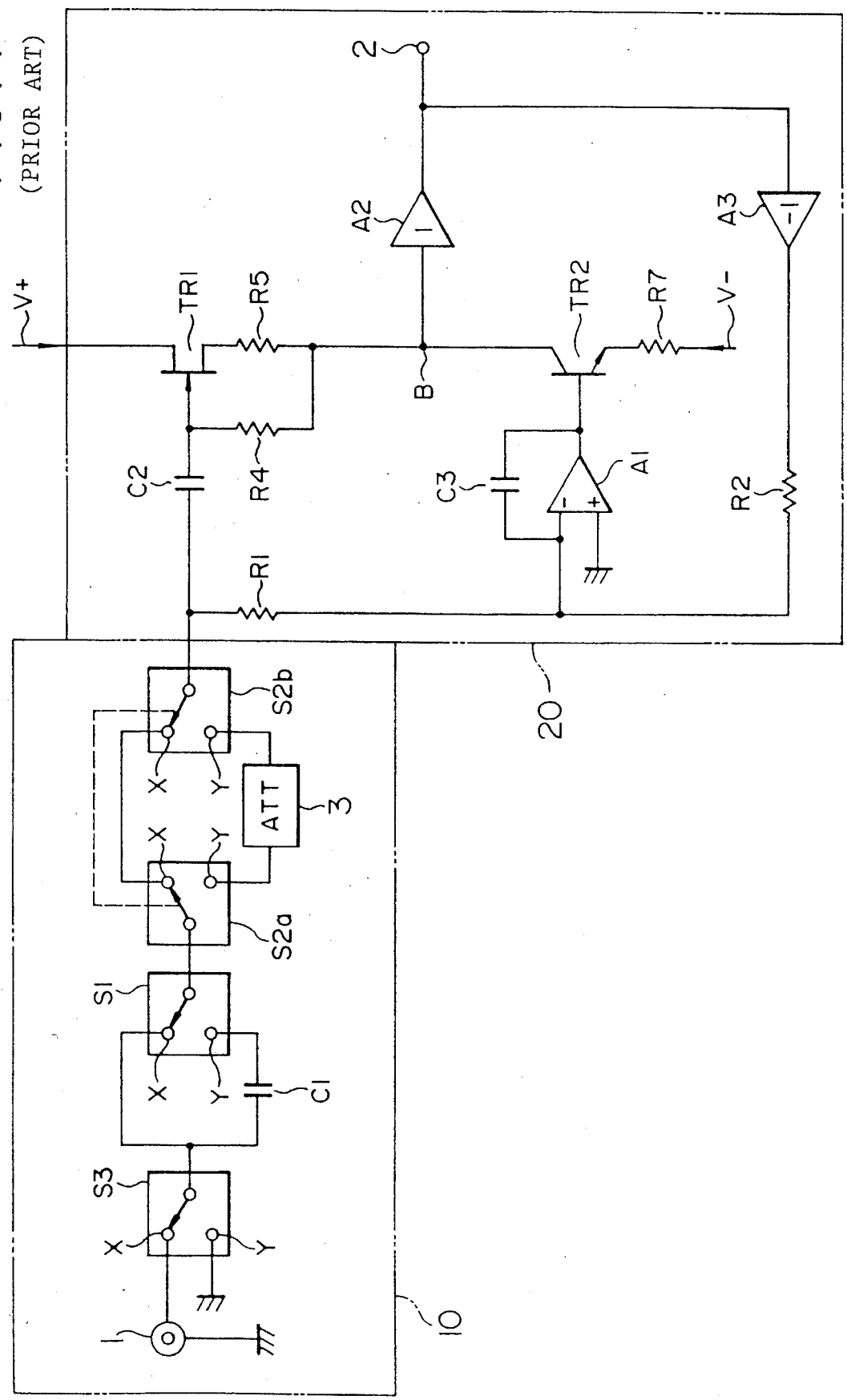
FIG. 1 is a circuit diagram showing a conventional example of an input circuit of an apparatus for measuring an electric signal.

First, an input coupling switching section (input signal path or input signal circuit portion) 100 corresponds to a section obtained by omitting the switch S3 for ground switching from the input coupling switching section 10 in FIG. 1. Therefore, the input connector 1 is directly connected to the terminal X of the switch S1 and is also connected to the terminal Y of the switch S1 through the capacitor C1.

In a composite buffer amplifier 200, a switch S3a for ground switching, corresponding to the switch S3 in FIG. 1, is provided before an addition point A at which an input signal that is given from the input coupling switching section 100 through the resistor R1 and a feedback signal that is given from the feedback loop to the DC operational amplifier A1 are added. That is, the switch S3a is provided between the addition point A of the feedback signal and the resistor R1. One input terminal X of the switch S3a is connected to the resistor R1, the other input terminal Y is connected to the ground through a resistor R3, and the output terminal C is connected to the addition point A. An electrical switch, for example, a transistor, a CMOS, or the like, can be used as the switch S3a, and a CMOS analog switch is used here. By providing the switch for ground switching at the front stage of the addition point A of the composite buffer amplifier as mentioned above, the ground level is detected on the low frequency amplifying circuit side.

A switch S3b for shutting off a power source voltage from the power source V+ that is applied to the buffer transistor TR1 of the high frequency signal path interlockingly with the switch S3a is provided. The input terminal C of the switch S3b is connected to the power source V+, one output terminal X is connected to the source of the buffer transistor TR1, and the other output terminal Y is connected to the addition point B through a resistor R6 and a rectifying element such as a diode D2. An electrical switch, for example, a transistor, a CMOS, or the like can be used as the switch S3b, and a CMOS analog switch is used here.

The switches S3a and S3b are commonly controlled by a control signal that is given to an input terminal 5. When the switch S3a is connected to the terminal X side or the terminal Y side, the switch S3b is connected to the terminal X side or the terminal Y side, respectively. This is because when the switch S3a is connected to the terminal Y side, namely, when the input of the amplifier A1 is connected to the ground, the switch S3b is connected to the terminal Y side in order to prevent that the high frequency signal from the input coupling switching section 100 from being given to the addition point B, thereby shutting off the power source to the buffer transistor TR1 of the high frequency amplifying circuit. In this instance, the buffer transistor TR1 is turned off, and the current given to the collector of the transistor TR2 of the low frequency amplifying circuit through the terminal X of the switch S3b, buffer transistor TR1, resistor R5, and rectifying element such as a diode D1 is shut off, so that the transistor TR2 is turned off, and the low frequency amplifying circuit is turned off in such a state. Therefore, a bias current path (operation current path) comprising the resistor R6 and diode D2 is provided between the terminal Y of the switch S3b and the addition point B, thereby giving the current from the power source V+ to the collector of the transistor TR2 through the bias current path. Due to this, even when the switch S3a is connected to the ground, the transistor TR2 is continuously turned on. Namely, since the transistor TR2 operates as a current source of the low frequency amplifying circuit (operational amplifier A1), the current to the collector of the transistor TR2 becomes a bias current (operation current) of the low frequency amplifying circuit. Even when the switch S3a is connected to the ground, the bias current is given to the low frequency amplifying circuit as mentioned above, the low frequency amplifying circuit is continuously held in the on state, and the feedback signal (negative feedback signal) continuously flows to the feedback loop (negative feedback loop), so that the feedback signal of the feedback loop of the low frequency amplifying circuit is assured.

The resistance value of the resistor R6 is set in a manner such that the current value that is given to the transistor TR2 through the switch S3b, resistor R6, and diode D2 when the switch S3b is connected to the terminal Y and the FET buffer transistor TR1 is off is equal to the current value in the case where the switch S3b is connected to the terminal X.

The diode D2 is provided so that, when the switch S3b is connected to the terminal X and the diode D1 is on, the current flowing through the diode D1 does not flow into the circuit comprising the switch S3b and resistor R6 of a large capacitance with an adverse influence being exerted on the frequency characteristics of the composite buffer circuit. Namely, the diode D2 is provided to perform an electrical isolation.

Similarly, the diode D1 is provided so that, when the switch S3b is connected to the terminal Y and the diode D2 is on, the current flowing through the diode D2 does not flow into the FET buffer transistor TR1 with an adverse influence being exerted on the frequency characteristics of the composite buffer circuit. That is, the diode D1 is provided to perform an electrical isolation.

The feedback capacitor C3 of the DC operational amplifier constructs an integrating circuit in combination with the feedback resistor R2. The crossover frequency of the DC operational amplifier A1 and high frequency amplifying circuit is determined by the time constant of the integrating circuit. Further, in case of the embodiment, there is the following relation among the resistors R1, R2, and R3. Since the gain of the high frequency amplifying circuit is equal to 1 because of a source-follower circuit, in order to make the gain constant over the whole frequency, it is also necessary to set the gain of the low frequency amplifying circuit to the same value as that of the high frequency amplifying circuit. Therefore, for instance, the values of resistors R1 and R2 are selected to be 1 MΩ, thereby setting the gain of the low frequency amplifying circuit to 1.

The operation of the embodiment will now be described.

The high frequency signal component in the signal which passed through the input coupling switching section 100 passes through the capacitor C2 and is transferred to the gate of the FET buffer transistor TR1 of the source-follower. However, the DC and low frequency components pass through the resistor R1 and are transferred to the addition point A of the DC operational amplifier A1. In the invention, the CMOS analog switch S3a is provided in the front stage portion of the addition point A, and, by switching the input of the switch S3a to the terminal Y side, the DC component of the input signal from the input coupling switching section is shut off, thereby enabling the addition point A to be connected to the ground through the resistor R3 and enabling the ground level to be detected. The output of the DC operational amplifier A1 is converted into the current by the transistor TR2 and resistor R7 and is added to the signal from the high frequency amplifying circuit at the addition point B. The added signal is output through the buffer amplifier A2. A part of the output is returned to the addition point A through the inverting buffer amplifier A3 and the feedback resistor R2.

As mentioned above, the switch S3$b$ is a CMOS analog switch interlocked with the switch S3$a$. When the switch S3$a$ is connected to the terminal X, the switch S3$b$ is connected to the terminal X. The low frequency signal component of the signal from the input coupling switching section flows into the low frequency amplifying circuit. The high frequency signal component of the signal from the input coupling switching section flows into the high frequency amplifying circuit. Those low and high frequency signal components are added at the addition point B, and the added signal is output through the buffer amplifier A2 and is also returned to the low frequency amplifying circuit through the feedback loop.

On the other hand, when the switch S3$a$ is connected to the terminal Y and is connected to the ground, the switch S3$b$ is simultaneously connected to the terminal Y, and no power source voltage is given to the source of the buffer TR1 of the high frequency amplifying circuit, so that the buffer TR1 is turned off. Therefore, the current given to the collector of the transistor TR2 through the diode D1 is shut off. However, in place of such a current, the current from the power source V+ is given through the terminal Y of the switch S3$b$, resistor R6, and diode D2, and so the transistor TR2 is continuously held in the on state. Consequently, even when the switch S3$a$ is connected to the ground, the feedback signal (negative feedback signal) flows to the feedback loop and the bias current is supplied to the low frequency amplifying circuit, and so the feedback signal of the feedback loop of the low frequency amplifying circuit is assured (maintained). Thus, the ground level is output to the output terminal 2.

A state in which the switch S3$a$ is connected to the ground, namely, an equivalent circuit of the input circuit when both of the switches S3$a$ and S3$b$ are connected to the terminals Y, is shown in FIG. 3. As will be obviously understood from FIG. 3, when the value of resistor R3 is equalized to the value of resistor R1, a state that is equivalent to a state in which the input coupling switching section is connected to the ground is derived.

The states of switches S1, S2$a$, and S2$b$ are not concerned with the states of the switches S3$a$ and S3$b$. That is, each of the switches S1, S2$a$, and S2$b$ can be also connected to either one of their respective X and Y terminals irrespective of the states of the switches S3$a$ and S3$b$.

In the above embodiment, the input coupling switching section has the capacitor C1 and attenuator 3 and, further, has the switches S1, S2$a$, and S2$b$ for selectively connecting to them. The invention, however, can be also applied to an input circuit which does not have at least one of the capacitor C1 and the attenuator 3 and also does not have the switch associated with an omitted one of them. That is, in the case where the input circuit does not have the capacitor C1 and switch S1, the input coupling switching section becomes merely an input signal path.

According to the invention as mentioned above, since the switch for ground switching has been provided at the front stage of the addition point of the feedback loop of the low frequency amplifying circuit, the voltage that is applied to the switch is maintained at a voltage near about 0 V, so that there is no need to use a switch of a high withstanding voltage. Therefore, a cheap electronic switch of a low withstanding voltage and a low electric power consumption that is easily programmable, for example, a CMOS type electronic switch, can be used. Since no switch for ground switching is provided in the input coupling switching section (input signal path), the signal path length of the input coupling switching section can be reduced to a length shorter than the conventional one. Therefore, an input circuit of a wide band can be realized.

Comparison will be made between the aforesaid JP-B-59-10506 and the present invention thus constructed. In the JP-B-59-10506, the high-frequency path is grounded through a capacitor to thereby shut off the high frequency signal, while in the present invention, the current supplied to the FET and the diode constituting the high frequency signal path is shut off by the switch 3$b$ to thereby open and shut off the high frequency signal path.

As a consequence, the present invention is advantageous in that the amount of fluctuation of the input impedance of the input circuit is small, and hence the measuring section is little influenced. In contrast, in the JP-B-59-10506, since the input impedance of the input circuit is low, the measuring section seems to be influenced largely.

Consequently, the invention is very effective when it is applied to the input circuit for use in an apparatus for measuring an electric signal such as an FFT analyzer represented by an oscilloscope, digitizer for sampling a waveform, or the like.

What is claimed is:

1. An input circuit for an apparatus having a measuring section for measuring an electric signal, said input circuit comprising:

an input signal circuit portion having an input terminal adapted to receive an input signal to be measured and an output terminal for outputting the electric signal to be measured; and a composite buffer amplifying circuit connected to said output terminal of said input signal circuit portion, wherein said composite buffer amplifying circuit includes:

a high frequency amplifying circuit connected to said output terminal of said input signal circuit portion, for amplifying the high frequency signal component of the input signal to be measured, a first switch having an input selectively connected to one of said output terminal of said input signal circuit portion and a ground level terminal, for selectively outputting one of the electric signal to be measured from said output terminal and the ground level, a low frequency amplifying circuit connected to an output of said first switch for amplifying the low frequency signal component of the output signal from said first switch, adding means for adding the output of said high frequency amplifying circuit and the output of said low frequency amplifying circuit to obtain an added signal and for outputting the added signal to said measuring section, a negative feedback circuit for negative-feeding back the added signal from said adding means to said first switch, and a second switch for selectively shutting off power source voltage to said high frequency amplifying circuit in an interlocking relation with said first switch.

2. An input circuit according to claim 1, wherein when the input of said first switch is connected to said ground level terminal, said second switch shuts off the power source voltage that is supplied to said high frequency amplifying circuit.

3. An input circuit according to claim 2, wherein said composite buffer amplifying circuit further includes means for supplying an operation current to make said low frequency amplifying circuit operative to said low frequency amplifying circuit irrespective of a state of said first switch.

4. An input circuit according to claim 2, wherein said composite buffer amplifying circuit further includes:

means for supplying the output of said high frequency amplifying circuit to said low frequency amplifying circuit as an operation current to make said low frequency amplifying circuit operative, and means for supplying an operation current to said low frequency amplifying circuit to make said low frequency amplifying circuit operative when said second switch shuts off the power source voltage to said high frequency amplifying circuit.

5. An input circuit according to claim 2, wherein said composite buffer amplifying circuit further includes means for supplying the output of said high frequency amplifying circuit to said low frequency amplifying circuit as an operation current to make said low frequency amplifying circuit operative, wherein said second switch has an input and first and second outputs, the first and second outputs being selectively connected to said input, said input of said second switch is connected to a supply source of said power source voltage, said first output of said second switch is connected to the high frequency amplifying circuit, and said second output of said second switch is connected to said low frequency amplifying circuit through an operation current means, wherein, when the input of said first switch is connected to the output of said input signal circuit portion, the input of said second switch is connected to said first output, and wherein, when the input of said first switch is connected to said ground level terminal, the input of said second switch is connected to said second output to thereby supply said power source voltage to said low frequency amplifying circuit through said operation current means to maintain said low frequency amplifying circuit operative.

6. An input circuit according to claim 1, wherein each of said first and second switches is an electronic switch.

7. An input circuit according to claim 1, wherein said input signal circuit portion includes a circuit for selectively AC or DC coupling said input terminal and said composite buffer amplifying circuit.

8. An input circuit for an apparatus having a measuring section for measuring an electric signal, said input circuit comprising:

an input signal circuit portion having an input terminal adapted to receive an input signal to be measured and an output terminal for outputting the electric signal to be measured; and a composite buffer amplifying circuit connected to said output terminal of said input signal circuit portion, wherein said composite buffer amplifying circuit includes:

a high frequency amplifying circuit connected to said output terminal of said input signal circuit portion, for amplifying and outputting a high frequency signal component of the input signal to be measured, a first switch having an input selectively connected to one of said output terminal of said input signal circuit portion and a ground level terminal, for selectively outputting one of the electric signal to be measured from said output terminal and the ground level, a low frequency amplifying circuit connected to an output of said first switch for amplifying and outputting the low frequency signal component of the output signal from said first switch, an addition point connecting the output of said high frequency amplifying circuit and the output of said low frequency amplifying circuit, for adding the outputs from said high frequency amplifying circuit and said low frequency amplifying circuit to obtain an added signal, and for outputting the added signal to said measuring section, a negative feedback circuit for negative-feeding back the added signal from said addition point to the input side of said first switch, and a second switch having an input and first and second outputs, the first and second outputs being selectively connected to said input in an interlocking relation with said first switch, wherein said input of said second switch is connected to a supply source of a power source voltage, said first output is connected to said high frequency amplifying circuit, and said second output is connected to said low frequency amplifying circuit through said addition point, wherein, when the input of said first switch is connected to the output of said input signal circuit portion, said input of said second switch is connected to said first output to thereby supply said power source voltage to said high frequency amplifying circuit as a voltage to make said high frequency amplifying circuit operative, so that said high frequency amplifying circuit supplies its output to said low frequency amplifying circuit to thereby make said low frequency amplifying circuit operative, and wherein, when the input of said first switch is connected to the ground level terminal, the input of said second switch is connected to said second output, so that the power source voltage is supplied to said low frequency amplifying circuit through said addition point, thereby making said low frequency amplifying circuit operative.

9. An input circuit according to claim 8, wherein each of said first and second switches is an electronic switch.

10. An input circuit according to claim 8, wherein said composite buffer amplifying circuit further include first and second rectifying elements provided between said addition point and the output of said high frequency amplifying circuit and between said addition point and said second output of said second switch, respectively.

11. An input circuit according to claim 8, wherein said input signal path includes a circuit for selectively AC or DC coupling said input terminal and said composite buffer amplifier.

* * * * *